United States Patent
Lee

(10) Patent No.: US 8,866,657 B2
(45) Date of Patent: Oct. 21, 2014

(54) APPARATUS AND METHOD FOR CONVERTING ANALOG SIGNAL TO DIGITAL SIGNAL

(71) Applicant: Samsung Electronics Co. Ltd., Suwon-si (KR)

(72) Inventor: Jong-Woo Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/713,913

(22) Filed: Dec. 13, 2012

(65) Prior Publication Data

US 2013/0154864 A1  Jun. 20, 2013

(30) Foreign Application Priority Data

Dec. 16, 2011 (KR) .................. 10-2011-0136685

(51) Int. Cl.
*H03M 1/66* (2006.01)
(52) U.S. Cl.
USPC .......................................... 341/144; 341/148
(58) Field of Classification Search
USPC ........... 341/144, 153, 148; 327/379, 382, 389
See application file for complete search history.

(56) References Cited

U.S. PATENT DOCUMENTS

| 4,340,856 | A | 7/1982 | Orlandi |
| 6,556,161 | B2 | 4/2003 | Nuijten |
| 7,015,846 | B2 * | 3/2006 | Lin ............................... 341/144 |
| 7,573,922 | B2 * | 8/2009 | Kamatani et al. .......... 372/38.01 |
| 7,928,788 | B2 * | 4/2011 | Jiang ............................. 327/231 |
| 8,536,899 | B1 * | 9/2013 | Lu et al. ......................... 327/51 |
| 2002/0184505 | A1 | 12/2002 | Mihcak et al. |
| 2003/0191788 | A1 | 10/2003 | Auyeung et al. |
| 2007/0177665 | A1 | 8/2007 | Zhou et al. |
| 2008/0159387 | A1 | 7/2008 | Dvir et al. |

FOREIGN PATENT DOCUMENTS

| JP | 2008-191675 A | 8/2008 |
| KR | 10-2012-0010378 A | 2/2012 |

* cited by examiner

*Primary Examiner* — Brian Young
(74) *Attorney, Agent, or Firm* — Jefferson IP Law, LLP

(57) ABSTRACT

An apparatus of a Digital-to-Analog Converter (DAC) is provided. The apparatus includes a logic circuit for performing a logical operation based on a combination of bit values $b_0$ through $b_{N-1}$ of a digital code, and a plurality of switches for controlling an output state of a plurality of current cells based on an output of the logical operation, wherein the plurality of the current cells respectively output currents under a control of respective ones of the plurality of switches.

16 Claims, 6 Drawing Sheets

 
FIG.5A
(RELATED ART)
FIG.5B

APPARATUS AND METHOD FOR CONVERTING ANALOG SIGNAL TO DIGITAL SIGNAL

PRIORITY

This application claims the benefit under 35 U.S.C. §119 (a) of a Korean patent application filed on Dec. 16, 2011 in the Korean Intellectual Property Office, and assigned Serial No. 10-2011-0136685, the entire disclosure of which is hereby incorporated by reference.

BACKGROUND OF THE INVENTION

1. Field of the Invention

The present invention relates to an analog-to-digital converter. More particularly, the present invention relates to an analog-to-digital converter circuit using current mixing which increases exponentially.

2. Description of the Related Art

A Digital-to-Analog Converter (DAC), which may also be referred to as an analog-to-digital converter, is a circuit for converting an n-bit input digital signal into an analog signal, and is an element that is widely used in applications including instrumentation, control, communication, imaging, and other similar electronic devices.

FIG. 1 depicts a method for converting a digital signal to an analog signal according to the related art.

Referring to FIG. 1, when a 2-bit digital signal is input, a current corresponding to 2-bit digital information flows to output an analog signal. A general linear DAC converts the 2-bit digital signal that is uniformly quantized into the analog value as shown in FIG. 1. To generate a weak signal within a quantization noise, as shown in the bottom left area of FIG. 1, bits need to be expanded to increase steps. For example, a 4-step quantization may be controlled with 2 bits and its Dynamic Range (DR) or resolution is 13.8 dB. When the bits are extended to 3 bits, the DR of 19.82 dB is attained. In theory, as the number of the bits increases by one bit, the DR increases by 6.02 dB for each increased bit.

Analog signals, such as sound, light, vibration, concentration, or any other similar and/or suitable analog value, in the natural word may change in a non-linear manner, and instead, may have exponential change rates, and sensory systems of humans may have logarithmic characteristics for sensing the exponential changes. For example, in the case of analog audio signals, whispers may be quite audible in a quiet room, whereas a loud voice may be inaudible in a noisy place next to an aircraft engine. Such characteristics of analog audio signals are due to a human auditory system having logarithmic characteristics which are sensitive to the weak signal but insensitive to the strong signal, and this is also applied to image information input to human eyes. Hence, a decibel dB unit is used by taking a logarithmic value from the absolute value of such analog signals, such as the naturally occurring signals of sound and light, and multiplying the logarithmic value by 20.

Accordingly, high-fidelity devices may be maximized up to the sensitive range of human sensory systems in order to have a high DR, i.e. resolution, which generally ranges from 80 dB to 120 dB. The sensory range of 80 dB to 120 dB may be converted to generate digital information values ranging from 16 bits to 24 bits, and thus, a data size may increase for such high-fidelity devices. That is, even a strong signal that may relatively insensitive may be finely quantized by high-fidelity devices so as to cause inefficiency.

Therefore, a need exists for a system and method for a DAC for converting the digital signal to the non-linear analog signal with high fidelity without increasing a digital code.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a Digital-to-Analog Converter (DAC) circuit for linearly responding to a dB unit given on a log scale.

Another aspect of the present invention is to provide a current cell circuit which is a basic unit using current mixing so as to exponentially increase a current value when a control code increases in a DAC circuit.

According to one aspect of the present invention, an apparatus of a DAC is provided. The apparatus includes a plurality of current cells in the DAC. When a plurality of output current value candidates of a total output current value of the plurality of current cells are arranged based on a respective size of each output current value of the plurality of output current value candidates, the plurality of output current value candidates form a geometric series.

According to another aspect of the present invention, an apparatus of a DAC is provided. The apparatus includes a logic circuit for performing a logical operation based on a combination of bit values $b_0$ through $b_{N-1}$ of a digital code, and a plurality of switches for controlling an output state of a plurality of current cells based on an output of the logical operation, wherein the plurality of the current cells respectively output currents under a control of respective ones of the plurality of switches.

According to yet another aspect of the present invention, a method for converting a digital signal to an analog signal is provided. The method includes performing a logical operation based on a combination of bit values $b_0$ through $b_{N-1}$ of a digital code, controlling an output state of a plurality of current cells based on an output of the logical operation, and outputting an analog signal by summing currents output from each of the plurality of current cells.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 5A a diagram of an image according to linear quantization and exponential quantization in a DAC according to the related art;

FIG. 5B is a diagram of an image according to linear quantization and exponential quantization in a DAC according to an exemplary embodiment of the present invention.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide a digital-analog conversion circuit using current mixing which exponentially increases.

Figure 1:
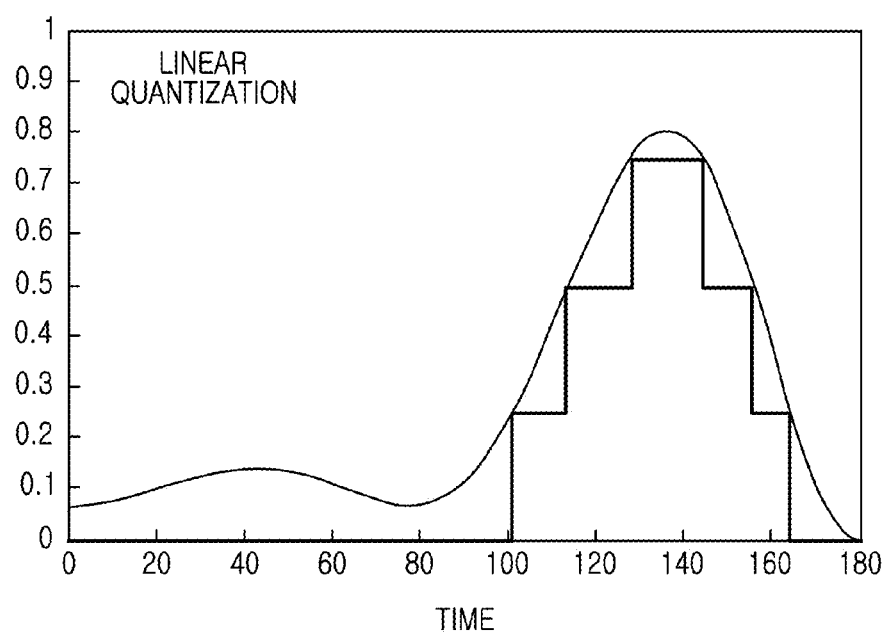
FIG. 1 is a diagram of a method for converting a digital signal to an analog signal according to the related art.
Figure 2:
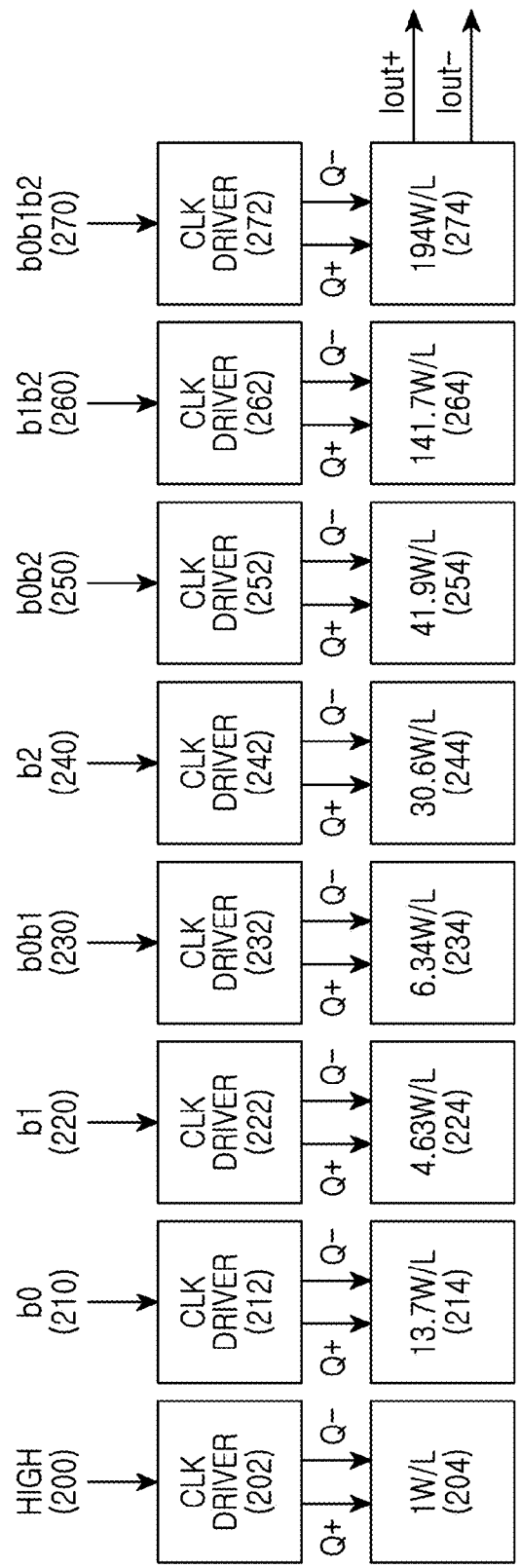
FIG. 2 is a diagram of a Digital-to-Analog Converter (DAC) using current mixing which increases exponentially according to an exemplary embodiment of the present invention.

FIG. 2 depicts a Digital-to-Analog Converter (DAC) using current mixing which increases exponentially increases to an exemplary embodiment of the present invention.

Referring to FIG. 2, the DAC may be controlled by a 3-bit digital code b2b1b0 and may include a plurality of current cells 204, 214, 224, 234, 244, 254, 264, and 274, and clock (CLK) drivers 202, 212, 222, 232, 242, 252, 262, and 272, which may also be referred to as switches, for controlling outputs of the current cells 204 through 274. The current cells 204 through 274 output the corresponding current according to their respective switches, including a first switch 200 that is turned on all the time. Also, a second switch 210, a third switch 220, and a fifth switch 240 are directly controlled by the 3-bit digital code. A fourth switch 230 operates according to an AND operation of the first bit b0 and the second bit b1 of the digital code. For example, the fourth switch 230 may operate when the first bit and the second bit of the digital code are '1'.

Similarly, a sixth switch 250 operates according to the AND operation of the first bit b0 and the third bit b2 of the digital code. For example, the sixth switch 250 may operate when the first bit b0 and the third bit b2 of the digital code are '1'. A seventh switch 260 operates according to the AND operation of the second bit b1 and the third bit b2 of the digital code. For example, the seventh switch 260 may operate when the second bit b1 and the third bit b2 of the digital code are '1'. An eighth switch 270 operates according to an AND operation of the first bit b0, the second bit b1, and the third bit b2 of the digital code. For example, the eighth switch 270 may operate when all of the first bit b0, the second bit b1, and the third bit b2 of the digital code are '1'.

According to various implementations of the present exemplary embodiment, the number of the current cells and the number of the switches are not limited to the numbers depicted in FIG. 2, and may vary according to a digital code size and a Dynamic Range (DR) or resolution, and the AND operation for controlling switches excluding the switches controlled by the digital code can also vary. In other words, the number of the current cells and the number of the switches may be any suitable and/or similar number.

The exemplary embodiment of the present invention may be formed so as to be in a transistor segment structure for exponentially increasing a gain for an N-bit digital code, and the output current according to the digital code may be generalized based on Equation 1.

$$I = I_0 \cdot 10^{(\frac{k}{2L}-1)C} \qquad \text{Equation 1}$$

$I_0$ denotes a constant with an initial value $10^{-C}$–$I_0$ when the digital code is zero, L denotes the digital code size, k denotes a digital code value and is an integer ranging between 0 and 2L, and C is a compression constant. That is, the compression constant C determines how sensitively the DAC responds to a weak signal component. For example, an increased value of the compression constant C provides a more sensitive response to the weak signal component, and a decreased value of the compression constant C provides a less sensitive response to the weak signal component.

In the present exemplary embodiment, in order to attain a DR over 80 dB, the 3-bit digital code b0, b1 and b2, having a size L=3, and C=3 are applied. Output current values according to the digital code value based on Equation 1 are arranged in Table 1. An initial current is $I_0$=1000.

TABLE 1

| digital code value (k) | output current |
|---|---|
| 0 (b2b1b0 = 000) | 1.000 |
| 1 (b2b1b0 = 001) | 2.371 |
| 2 (b2b1b0 = 010) | 5.623 |
| 3 (b2b1b0 = 011) | 13.335 |
| 4 (b2b1b0 = 100) | 31.623 |
| 5 (b2b1b0 = 101) | 74.989 |
| 6 (b2b1b0 = 110) | 177.828 |
| 7 (b2b1b0 = 111) | 421.697 |

In a case where the digital code is zero, i.e. k=0 and b2b1b0=000, then every current, excluding the initial current, is cut and thus a current of 0.001*10, wherein 10=1000, flows. That is, when k=⁰, the current 0.001*10 always flows through the first current cell 204 regardless of the digital code value in FIG. 2.

In a case where k=1, the second switch 210 is turned on and a current of 0.00237*10 flows to the output stage. Herein, when k=1, the current flowing through the first current cell 204 and the current flowing through the second current cell 214 should be added and the current of 0.00237*10 should flow into the output stage. Accordingly, the output current of the second current cell 214 should be 1.37, wherein ((0.00237−0.001)*1000)=1.37.

In a case where k=2, the third switch 220 is turned on and a current of 0.0056*10 flows. Herein, since the current flowing through the first current cell 204 and the current flowing through the third current cell 224 should be added together and the current of 0.00563*10 should flow into the output stage, the output current of the third current cell 224 should be 4.63, wherein ((0.00563-0.001)*1000)=4.63.

In a case where k=3, all of the second through fourth switches 200, 210, and 220 are turned on and a current of 0.0133*10 flows to the output stage. Herein, when k=3, the currents flowing through the first current cell 204, the second current cell 214, the third current cell 224, and the fourth current cell 234 should be added together and the current of 0.0133*10 should flow into the output stage. Accordingly, the output current of the fourth current cell 234 should be 6.3, wherein ((0.0133-0.00463-0.00137-0.001)*1000)=6.3.

In a case where k=4, the third switch 220 is turned on and the output is a current of 0.0316*10. Herein, when k=4, the current flowing through the first current cell 204 and the current flowing through the fifth current cell 244 should be added together and the current of 0.0316*10 should flow into the output stage. Accordingly, the output current of the fifth current cell 244 should be 30.6, wherein ((0.0316-0.001)*1000)=30.6.

In a case where k=5, the second switch 210 and the fifth switch 240 are turned on in order to output a current of 0.075*10. Herein, when k=5, the currents flowing through the first current cell 204, the second current cell 214, the fifth current cell 244, and the sixth current cell 254 should be added together and the current of 0.075*10 should flow into the output stage. Accordingly, the output current of the sixth current cell 254 should be 41.9, wherein (74.9−30.6−1.37−1)=41.9.

In a case where k=6, the third switch 220 and the fifth switch 240 are turned on in order to output a current of 0.1778*10. The currents flowing through the first current cell 204, the third current cell 224, the fifth current cell 244, and the seventh current cell 264 should be added together and the current of 0.1778*10 should flow into the output stage. Accordingly, the output current of the seventh current cell 264 should be 141.6, wherein (177.83−30.6−4.63−1)=141.6.

In a case where k=7, the second, third and fifth switches 210, 220, and 240 are turned on in order to output a current of 0.4217*10. The currents flowing through the first current cell 204, the second current cell 214, the third current cell 224, the fourth current cell 234, the fifth current cell 244, the sixth current cell 264, and the seventh current cell 264 should be added together and a current of 0.1778*10 should flow into the output stage. Accordingly, the output current of the eighth current cell 274 should be 194, wherein (421.7−141.7−41.9−30.6−6.34−4.63−1.37−1)=194.

In a general expression, when k=4×b2+2×b1+b0, the output current is expanded into a Taylor series. In such a case, the second, third, and fifth switches 210, 220, and 240 are set to '1' or zero, and b2N=b2, b1N=b1, and b0N=b0. Accordingly, a result may be produced according to Equation 2, shown below.

$$I_{OUT} = I \times 2^k = I \times 2^{4 \times b2 + 2 \times b1 + b0} \quad \text{Equation 2}$$
$$= I \times \left(1 + k \cdot \ln 10 \cdot C/2^L + (k \cdot \ln 10 \cdot C/2^L)^2 / 2! + (k \cdot \ln 10 \cdot C/2^L)^3 / 3! + \dots\right)$$
$$= 0.001 I_0 (1 + 1.37 \times b0 + 4.63 \times b1 + 6.34 \times b0 b1) \times (1 + 30.6 \times b2)$$

As stated above, transistor sizes are set to a Width/Length (W/L) ratio of W/L, 1.37 W/L, 4.63 W/L, 6.34 W/L, 30.6 W/L, 41.92 W/L, 141.68 W/L, and 194 W/L in order to attain the DR over 80 dB, and a control switch controls the seven switches by combining the 3-bit digital signal b2b1b0 which has a digital code size L=3. Herein, in the W/L ratio, W indicates a channel width of the transistor, and L indicates a length of the transistor, and the transistor size is determined by W/L, wherein the output power increases as the transistor size increases.

With respect to providing a more precise control, the output current of an 8-bit linear digital input has exponential characteristic, as shown in FIG. 5. The exponential characteristic changes according to the size or value of the compression constant C. The greater the size of C, the greater DR. According to the compression constant, a minimum quantization level value, i.e. a difference between the output current when k=1 and the output current when k=0, is given by Equation 3.

$$10^{(1/2^L-1)C} - 10^{-C} = 10^{-C}(10^{C/2^L} - 1) \quad \text{Equation 3}$$

The DR is given by Equation 4 by obtaining the log value from a reciprocal of Equation 3 and multiplying by 20.

$$DR = 20C - \frac{20}{2^L}C - 20\log\left(1 - 10^{-\frac{C}{2^L}}\right) \quad \text{Equation 4}$$

For example, in the 8-bit DAC with C=3, a theoretical DR is 91.26 dB. When the digital code value k is zero, then a DC error of $10^{-C}$ may occur, which can be corrected by adding $10^{-C}$ to the initial value.

Figure 3:
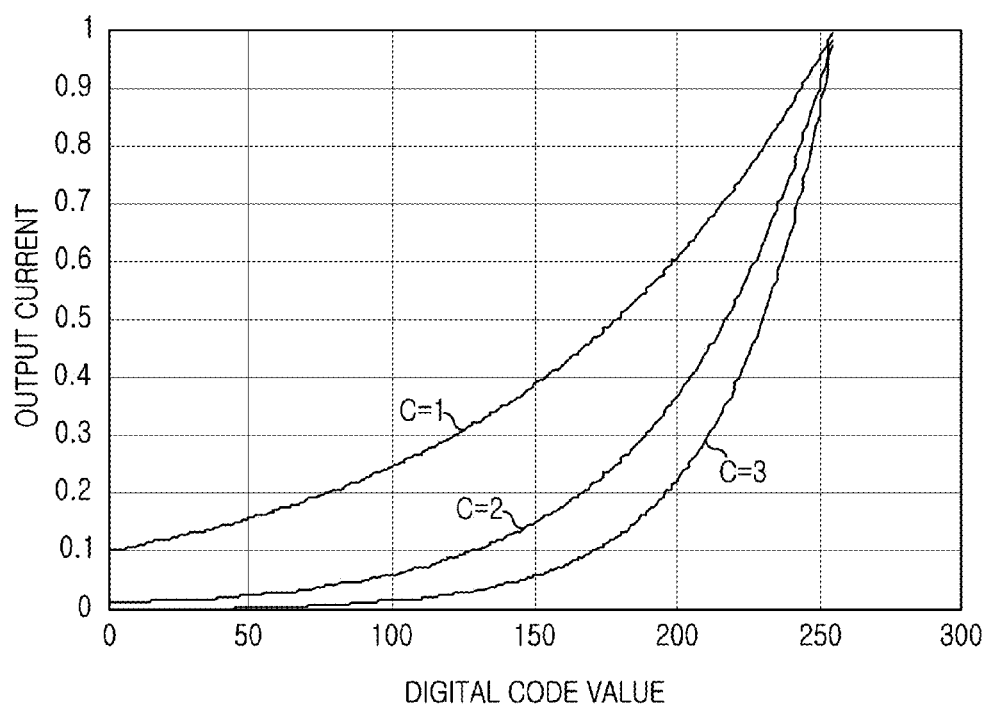
FIG. 3 is a graph of a relationship of a constant C, a digital code, and an output current according to an exemplary embodiment of the present invention.

FIG. 3 is a graph of a relationship of the constant C, the digital code, and the output current according to an exemplary embodiment of the present invention.

Referring to FIG. 3, the x axis indicates the digital code value k and the y axis indicate the output current. As the digital code value increases, the output current rises exponentially. The constant C determines the response level in the weak signal. Namely, the smaller the value of the constant C, the greater DR.

Figure 4:
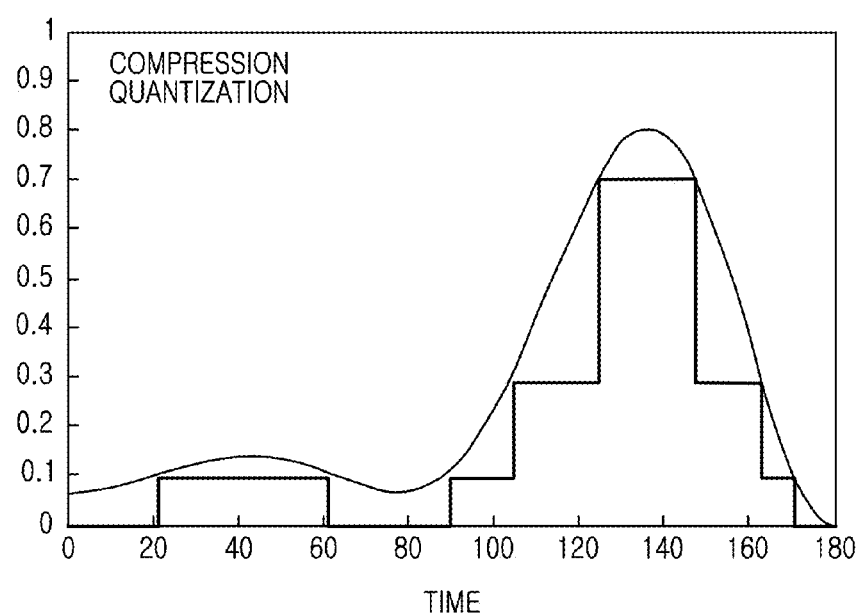
FIG. 4 is a diagram of digital-to-analog signal conversion according to an exemplary embodiment of the present invention.

FIG. 4 depicts the conversion of the digital signal to the analog signal according to an exemplary embodiment of the present invention.

Referring to FIG. 4, the DR may be increased by changing the analog signal, which was linearly converted in the related art, with the exponential characteristic. That is, the exponential quantization may be achieved through the nonlinear quantization so as to be sensitive to the weak signal and less sensitive to the strong signal. In the present exemplary embodiment, the compression constant C is 1 and may be quantized up to 10% of the whole size, and the DR is 21.76 dB. The DR of the exponential quantization is improved by approximately 60% in comparison with the DR of 13.8 dB in the linear quantization. Thus, it is possible to further increase the DR by adjusting the constant C.

Referring to the exemplary embodiment of FIG. 2, wherein the compression constant is C=3, and the DR for the 3-bit digital code is 57 dB, in such a case, when using a related-art linear DAC, such may use more than 9 bits to achieve the DR. Hence, when the constant C is 3, data efficiency improves more than three times.

FIG. 5A a diagram of an image according to linear quantization and exponential quantization in a DAC according to the related art. FIG. 5B is a diagram of an image according to linear quantization and exponential quantization in a DAC according to an exemplary embodiment of the present invention.

Referring to FIGS. 5A and 5B, a comparison of images respectively processed according to the linear quantization of the related art DAC and the exponential quantization of the DAC according to an exemplary embodiment, are shown. More particularly, FIG. 5A shows the related art 3-bit linear quantization, and FIG. 5B shows the 3-bit exponential quantization performed according to an exemplary embodiment of the present invention. Since the exponential quantization exhibits the greater DR with respect to the same 3-bit data information, FIG. 5B shows a softer image in a portion corresponding portion 100 of FIG. 5A.

Figure 6:
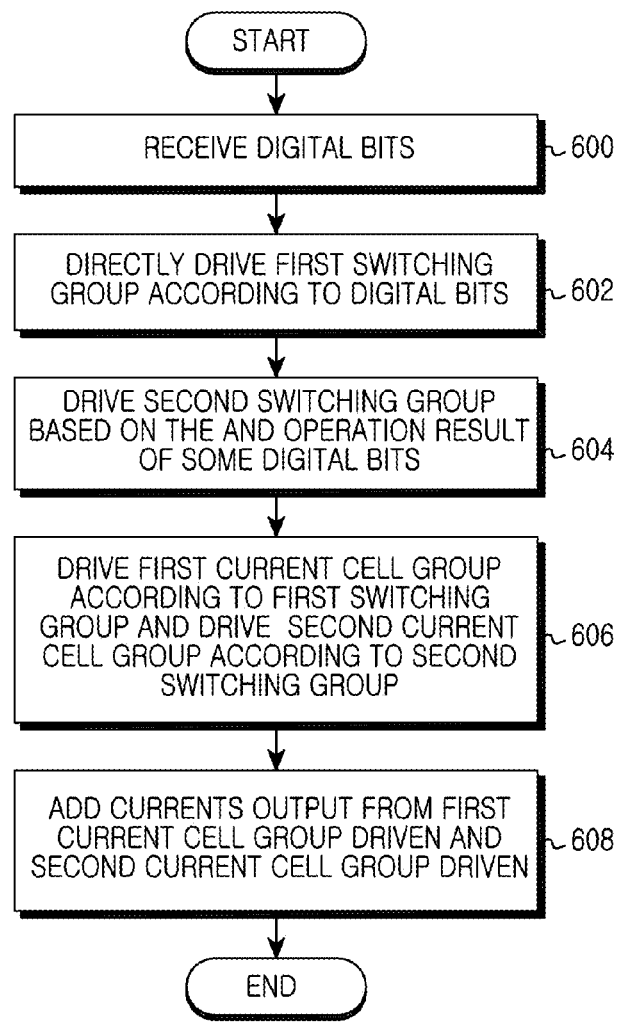
FIG. 6 is a flowchart of a digital-to-analog conversion method according to an exemplary embodiment of the present invention.

FIG. 6 is a flowchart of a digital-to-analog conversion method according to an exemplary embodiment of the present invention.

Referring to FIG. 6, the DAC receives the digital bits in operation 600 and directly drives a first switching group according to the digital bits in operation 602. For example, in FIG. 2, the switching operations of the second switch 210, the third switch 220, and the fifth switch 240 are determined directly by the digital bits.

In operation 604, the DAC drives a second switching group based on the AND operation result of some digital bits. For example, the fourth switch 230 operates based on the AND operation of the first bit b0 and the second bit b1 of the digital code. For example, the fourth switch 230 operates only when the first bit b0 and the second bit b1 of the digital code are '1'. Similarly, the sixth switch 250 operates based on the AND operation of the first bit b0 and the third bit b2 of the digital code. For example, the sixth switch 250 operates only when the first bit b0 and the third bit b2 of the digital code are '1'. The seventh switch 260 operates based on the AND operation of the second bit b1 and the third bit b2 of the digital code. For example, the seventh switch 260 operates only when the second bit b1 and the third bit b2 of the digital code are '1'. The eighth switch 270 operates based on the AND operation of the first bit b0, the second bit b1, and the third bit b2 of the digital code. For example, the eighth switch 270 operates only when all of the first bit b0, the second bit b1, and the third bit b2 of the digital code are '1'.

In operation 606, the DAC drives a first current cell group according to the first switching group and drives a second current cell group according to the second switching group. For example, with respect to the exemplary embodiment of FIG. 2, in a case where the digital code is zero, only the first current cell 204 is driven all the operational time of the DAC, regardless of the digital code value. In a case where k=1, the second switch 210 is turned on so as to drive the first current cell 204 and the second current cell 214. In a case where k=2, the third switch 220 is turned on to drive the first current cell 204 and the third current cell 224. In a case where k=3, the second switch 210, the third switch 220, and the fourth switch 230 are turned on to drive the first current cell 204, the second current cell 214, the third current cell 224, and the fourth current cell 234. In a case where k=4, the fifth switch 240 is turned on to drive the first current cell 204 and the fifth current cell 244. In a case where k=5, the second switch 210 and the fifth switch 240 are turned on to drive the first current cell 204, the second current cell 214, the fifth current cell 244, and the sixth current cell 254. In a case where k=6, the third switch 220 and the fifth switch 240 are turned on to drive the first current cell 204, the third current cell 224, the fifth current cell 244, and the seventh current cell 264. In a case where k=7, the second switch 210, the third switch 220, and the fifth switch 240 are turned on to drive all of the first current cell 204, the second current cell 214, the third current cell 224, the fourth current cell 234, the fifth current cell 244, the sixth current cell 264, and the seventh current cell 264.

In operation 608, the DAC adds the currents output from the first current cell group that is driven and the second current cell group that is driven and outputs the analog signal.

As set forth above, the analog signal, which is linearly converted in the related art, is changed with the exponential characteristic in order to increase the DR. Thus, the nonlinear quantization may achieve the exponential quantization which is sensitive to the weak signal and flexible to the strong signal. Since the nonlinear quantization may achieve the exponential quantization which is sensitive to the weak signal and flexible to the strong signal, an image or a sound more familiar to a user may be provided.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus of a Digital-to-Analog Converter (DAC), the apparatus comprising:
    a plurality of current cells in the DAC,
    wherein, when a plurality of output current value candidates of a total output current value of the plurality of current cells are arranged based on a respective size of each output current value of the plurality of output current value candidates, the plurality of output current value candidates form a geometric series, wherein the total output current value of the plurality of current cells exponentially increases according to variation of a digital code value.

2. The apparatus of claim 1, wherein the total output current value of the plurality of current cells is determined according to at least one of the plurality of output current value candidates when an output state of one or more switches of the plurality of current cells is changed according to an N-bit control signal,
    wherein each of the switches of the currents cells corresponds to one of the plurality of current cells.

3. The apparatus of claim 1, wherein the total output current value of the current cells is determined based on the following equation:

$$I = I_0 \cdot 10^{\left(\frac{k}{2^L}-1\right)C}$$

where $I_0$ denotes a constant with an initial value $10^{-C} \cdot I_0$ when a digital code is zero, L denotes a digital code size, k denotes the digital code value and is an integer from $0 \sim 2^L - 1$, and C is a compression constant, and the compression constant C determines how sensitively the DAC responds to a weak signal component.

4. The apparatus of claim 3, wherein the integer k is generated by combining bit values $b_0$ through $b_{L-1}$ of an L-bit digital code.

5. An apparatus of a Digital-to-Analog Converter (DAC), the apparatus comprising:
   a logic circuit configured to perform a logical operation based on a combination of bit values $b_0$ through $b_{N-1}$ of a digital code; and
   a plurality of switches configured to control an output state of a plurality of current cells based on an output of the logical operation,
   wherein the plurality of the current cells respectively output currents under a control of respective ones of the plurality of switches, and
   wherein the total output current value of the plurality of current cells exponentially increases according to variation of a digital code value.

6. The apparatus of claim 5, wherein the total current is determined according to at least one of a plurality of candidate output currents when the output state of one or more switches of the plurality of current cells changes according to an N-bit digital code,
   wherein each of the plurality of switches respectively corresponds to each of the plurality of current cells.

7. The apparatus of claim 5, wherein the output current of each current cell is determined based on the following equation:

$$I = I_0 \cdot 10^{\left(\frac{k}{2^L} - 1\right)C}$$

where $I_0$ denotes a constant with an initial value $10^{-C} \cdot I_0$ when the digital code is zero, L denotes a digital code size, k denotes the digital code value and is an integer from $0 \sim 2^L - 1$, and C is a compression constant, and
the compression constant C determines how sensitively the DAC responds to a weak signal component.

8. The apparatus of claim 7, wherein the integer k is generated by combining bit values $b_0$ through $b_{L-1}$ of an L-bit digital code.

9. The apparatus of claim 6, wherein a transistor size of each of the plurality of current cells is proportional to expanded terms of a Taylor series corresponding to the equation for determining the output current of each of the plurality of current cells.

10. The apparatus of claim 9, wherein each of the expanded terms of the Taylor series of the equation has a value 1 or 0 and respectively determines an output state of each of the plurality of switches.

11. A method for converting a digital signal to an analog signal, the method comprising:
   performing a logical operation based on a combination of bit values $b_0$ through $b_{N-1}$ of a digital code;
   controlling an output state of a plurality of current cells based on an output of the logical operation; and
   outputting an analog signal by summing currents output from each of the plurality of current cells, wherein a sum of the currents output from the plurality of current cells exponentially increases according to variation of a digital code value.

12. The method of claim 11, wherein the current output from the plurality of current cells is determined according to at least one of a plurality of candidate output currents when the output state of one or more switches of the plurality of current cells changes according to an N-bit digital code,
   wherein each of the plurality of switches respectively corresponds to each of the plurality of current cells.

13. The apparatus of claim 11, wherein the output current of each current cell is determined based on the following equation:

$$I = I_0 \cdot 10^{\left(\frac{k}{2^L} - 1\right)C}$$

where $I_0$ denotes a constant with an initial value $10^{-C} \cdot I_0$ when the digital code is zero, L denotes a digital code size, k denotes the digital code value and is an integer from $0 \sim 2^L - 1$, and C is a compression constant, and
the compression constant C determines how sensitively the DAC responds to a weak signal component.

14. The method of claim 13, wherein the integer k is generated by combining bit values $b_0$ through $b_{L-1}$ of an L-bit digital code.

15. The method of claim 13, wherein a transistor size of each of the plurality of current cells is proportional to expanded terms of a Taylor series corresponding to the equation for determining the output current of each of the plurality of current cells.

16. The method of claim 15, wherein each of the expanded terms of the Taylor series of the equation has a value 1 or 0 and respectively determines an output state of each of the plurality of switches.

* * * * *